United States Patent
Park et al.

(10) Patent No.: US 10,538,661 B2
(45) Date of Patent: *Jan. 21, 2020

(54) POLYESTER RESIN COMPOSITION WITH EXCELLENT IMPACT RESISTANCE AND LIGHT RELIABILITY AND MOLDED ARTICLE USING THE SAME

(71) Applicant: LOTTE ADVANCED MATERIALS CO., LTD., Yeosu-si (KR)

(72) Inventors: Young Ho Park, Uiwang-si (KR); Tae Gon Kang, Uiwang-si (KR); Yang Il Kim, Uiwang-si (KR); Chan Moo Park, Uiwang-si (KR); Sang Hyun Hong, Uiwang-si (KR)

(73) Assignee: Lotte Advanced Materials Co., Ltd., Yeosu-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/166,314

(22) Filed: Oct. 22, 2018

(65) Prior Publication Data

US 2019/0055399 A1 Feb. 21, 2019

Related U.S. Application Data

(63) Continuation of application No. 15/195,128, filed on Jun. 28, 2016, now Pat. No. 10,131,785.

(30) Foreign Application Priority Data

Jun. 30, 2015 (KR) .................. 10-2015-0093747

(51) Int. Cl.
| | |
|---|---|
| C08L 67/02 | (2006.01) |
| C08L 23/08 | (2006.01) |
| C08K 3/013 | (2018.01) |
| H01L 33/60 | (2010.01) |
| C08K 3/22 | (2006.01) |
| C08K 7/14 | (2006.01) |

(52) U.S. Cl.
CPC ............ *C08L 67/02* (2013.01); *C08K 3/013* (2018.01); *C08K 3/22* (2013.01); *C08K 7/14* (2013.01); *C08L 23/0869* (2013.01); *H01L 33/60* (2013.01); *H01L 2224/48091* (2013.01); *H01L 2224/48247* (2013.01)

(58) Field of Classification Search
CPC ..... C08L 67/02; C08L 23/0869; C08K 3/013; C08K 3/22; C08K 7/14; H01L 2224/48091; H01L 2924/00014; H01L 2224/48247; H01L 33/60
See application file for complete search history.

(56) References Cited

U.S. PATENT DOCUMENTS

| | | |
|---|---|---|
| 4,006,272 A | 2/1977 | Sakaguchi et al. |
| 4,027,073 A | 5/1977 | Clark |
| 4,034,013 A | 7/1977 | Lane |
| 4,045,514 A | 8/1977 | Iwahashi et al. |
| 4,139,600 A | 2/1979 | Rollmann et al. |
| 4,177,185 A | 12/1979 | Tacke et al. |
| 4,180,494 A | 12/1979 | Fromuth et al. |
| 4,185,044 A | 1/1980 | Tacke et al. |
| 4,287,315 A | 9/1981 | Meyer et al. |
| 4,303,772 A | 12/1981 | Novicky |
| 4,393,153 A | 7/1983 | Hepp |
| 4,400,333 A | 8/1983 | Neefe |
| 4,639,480 A | 1/1987 | Birum |
| 4,664,983 A | 5/1987 | Nakamura et al. |
| 4,694,031 A | 9/1987 | Morita et al. |
| 4,745,029 A | 5/1988 | Kambour |
| 4,753,980 A | 6/1988 | Deyrup |
| 4,788,251 A | 11/1988 | Brown et al. |
| 4,803,235 A | 2/1989 | Okada |
| 4,900,610 A | 2/1990 | Hochberg et al. |
| 4,906,202 A | 3/1990 | Germ |
| 4,906,696 A | 3/1990 | Fischer et al. |
| 4,990,549 A | 2/1991 | Delvin et al. |
| 5,025,066 A | 6/1991 | DeRudder et al. |
| 5,061,558 A | 10/1991 | Fischer et al. |
| 5,068,285 A | 11/1991 | Laughner |
| 5,124,402 A | 6/1992 | Laughner et al. |
| 5,189,091 A | 2/1993 | Laughner |
| 5,200,492 A | 4/1993 | Ohnaga et al. |

(Continued)

FOREIGN PATENT DOCUMENTS

| | | |
|---|---|---|
| CN | 1285858 A | 2/2001 |
| CN | 1376182 A | 10/2002 |

(Continued)

OTHER PUBLICATIONS

European Search Report in commonly owned European Application No. 08862371 dated Dec. 7, 2010, pp. 1-6.
International Search Report in commonly owned International Application No. PCT/KR2008/006870, dated May 28, 2009, pp. 1-2.
Office Action in commonly owned U.S. Appl. No. 12/631,018 dated Nov. 8, 2011, pp. 1-10.
Chinese Office Action in commonly owned Chinese Application No. 200910211954 dated Jun. 23, 2011, pp. 1-5.
English translation of Chinese Office Action in commonly owned Chinese Application No. 200910211954 dated Jun. 23, 2011, pp. 1-5.
Katrizky et al., "Correlation and Prediction of the Refractive Indices of Polymers by QSPR", Journal of Chemical Information and Computer Sciences, pp. 1171-1176, (1998).

(Continued)

*Primary Examiner* — Ling Siu Choi
*Assistant Examiner* — Gennadiy Mesh
(74) *Attorney, Agent, or Firm* — Additon, Higgins & Pendleton, P.A.

(57) ABSTRACT

A polyester resin composition and a molded article produced using the same. The polyester resin composition includes: (A) two polyester resins including an aliphatic ring structure and having different trans/cis isomer ratios in the aliphatic ring; (B) a white pigment; and (C) an inorganic filler, wherein the polyester resin composition has a crystallization temperature (Tc) of about 230° C. to about 250° C., as measured by differential scanning calorimetry (DSC) while cooling the resin composition at a cooling rate of −100° C./min.

12 Claims, 1 Drawing Sheet

(56) References Cited

U.S. PATENT DOCUMENTS

| | | |
|---|---|---|
| 5,219,915 A | 6/1993 | McKee et al. |
| 5,242,967 A | 9/1993 | Minnick |
| 5,256,718 A | 10/1993 | Yamamoto et al. |
| 5,280,070 A | 1/1994 | Drzewinski et al. |
| 5,284,916 A | 2/1994 | Drzewinski |
| 5,292,809 A | 3/1994 | Drzewinski et al. |
| 5,308,894 A | 5/1994 | Laughner |
| 5,369,154 A | 11/1994 | Laughner |
| 5,382,628 A | 1/1995 | Stewart et al. |
| 5,441,997 A | 8/1995 | Walsh et al. |
| 5,449,557 A | 9/1995 | Liebler et al. |
| 5,470,658 A | 11/1995 | Gasca et al. |
| 5,529,716 A | 6/1996 | Nomura et al. |
| 5,841,088 A | 11/1998 | Yamaguchi et al. |
| 5,849,380 A | 12/1998 | Kashiba et al. |
| 5,863,974 A | 1/1999 | Tjahjadi et al. |
| 6,060,538 A | 5/2000 | Gallucci |
| 6,238,732 B1 | 5/2001 | Cameron et al. |
| 6,252,002 B1 | 6/2001 | Yamada et al. |
| 6,277,905 B1 | 8/2001 | Keep |
| 6,310,129 B1 | 10/2001 | Lilly et al. |
| 6,486,251 B1 | 11/2002 | Patel |
| 6,506,830 B1 | 1/2003 | Bussi et al. |
| 6,545,089 B1 | 4/2003 | DeRudder et al. |
| 6,646,068 B2 | 11/2003 | Chisholm et al. |
| 6,653,391 B1 | 11/2003 | Weber et al. |
| 7,009,029 B2 | 3/2006 | Oka et al. |
| 7,294,659 B2 | 11/2007 | Yatake |
| 7,385,013 B2 | 6/2008 | Kobayashi et al. |
| 7,671,143 B2 | 3/2010 | Lee et al. |
| 7,732,515 B2 | 6/2010 | Jang et al. |
| 7,960,464 B2 | 6/2011 | Kobayashi et al. |
| 8,044,134 B2 | 10/2011 | Chung et al. |
| 8,044,143 B2 | 10/2011 | Park et al. |
| 8,178,608 B2 | 5/2012 | Nakamura et al. |
| 8,304,481 B2 | 11/2012 | Nakamura et al. |
| 8,426,549 B2 | 4/2013 | Ogasawara |
| 8,815,993 B2 | 8/2014 | Kim et al. |
| 8,933,158 B2 | 1/2015 | Shiobara et al. |
| 9,018,296 B2 | 4/2015 | Lee et al. |
| 9,062,198 B2 | 6/2015 | Lu |
| 9,187,621 B2 | 11/2015 | Lu |
| 9,437,790 B2 | 9/2016 | Kim et al. |
| 2002/0042483 A1 | 4/2002 | Vanderbilt |
| 2002/0111409 A1 | 8/2002 | Talibuddin |
| 2003/0032725 A1 | 2/2003 | Gaggar et al. |
| 2004/0102604 A1 | 5/2004 | Bassler et al. |
| 2004/0175466 A1 | 9/2004 | Douglas et al. |
| 2005/0113532 A1 | 5/2005 | Fish, Jr. et al. |
| 2005/0159533 A1 | 7/2005 | Nabeshima et al. |
| 2005/0165207 A1 | 7/2005 | Agarwal et al. |
| 2005/0239949 A1 | 10/2005 | Nakamura et al. |
| 2006/0004154 A1 | 1/2006 | DeRudder et al. |
| 2006/0030647 A1 | 2/2006 | Ebeling et al. |
| 2006/0051587 A1 | 3/2006 | Mori et al. |
| 2006/0100307 A1 | 5/2006 | Uerz et al. |
| 2006/0135690 A1 | 6/2006 | Juikar et al. |
| 2007/0155913 A1 | 7/2007 | Chakravarti et al. |
| 2007/0161741 A1 | 7/2007 | Ogasawara |
| 2007/0213458 A1 | 9/2007 | Topoulos |
| 2007/0265371 A1 | 11/2007 | Takahashi et al. |
| 2008/0009571 A1 | 1/2008 | Pixton et al. |
| 2008/0146718 A1 | 6/2008 | Gijsman et al. |
| 2008/0153954 A1 | 6/2008 | Arpin |
| 2008/0242789 A1 | 10/2008 | Zhu et al. |
| 2009/0069479 A1 | 3/2009 | Seki |
| 2009/0080079 A1 | 3/2009 | Kogure et al. |
| 2009/0118402 A1 | 5/2009 | Jang et al. |
| 2009/0209696 A1 | 8/2009 | Lee et al. |
| 2009/0215934 A1 | 8/2009 | Nakamura et al. |
| 2009/0253847 A1 | 10/2009 | Komatsu et al. |
| 2009/0275678 A1 | 11/2009 | Kumazawa et al. |
| 2010/0029855 A1 | 2/2010 | Matsuoka et al. |
| 2010/0113648 A1 | 5/2010 | Niessner et al. |
| 2010/0113656 A1 | 5/2010 | Saga |
| 2010/0152357 A1 | 6/2010 | Kwon et al. |
| 2010/0160529 A1 | 6/2010 | Lee et al. |
| 2010/0160532 A1 | 6/2010 | Park et al. |
| 2010/0168272 A1 | 7/2010 | Park et al. |
| 2010/0197827 A1 | 8/2010 | Kim et al. |
| 2010/0227957 A1 | 9/2010 | Fujii |
| 2010/0240831 A1 | 9/2010 | Kim et al. |
| 2010/0256288 A1 | 10/2010 | Kim et al. |
| 2011/0009524 A1 | 1/2011 | Kwon et al. |
| 2011/0021677 A1 | 1/2011 | Kwon et al. |
| 2011/0040019 A1 | 2/2011 | Kwon et al. |
| 2011/0160380 A1 | 6/2011 | Kwon et al. |
| 2011/0310622 A1 | 12/2011 | Topoulos |
| 2012/0065318 A1 | 3/2012 | Park et al. |
| 2012/0129989 A1 | 5/2012 | Kim et al. |
| 2012/0165448 A1 | 6/2012 | Lee et al. |
| 2012/0264868 A1 | 10/2012 | Lu |
| 2012/0264871 A1 | 10/2012 | Moon et al. |
| 2012/0305287 A1 | 12/2012 | Ni |
| 2012/0329938 A1 | 12/2012 | Kim et al. |
| 2013/0005875 A1 | 1/2013 | Shoji et al. |
| 2013/0158184 A1 | 6/2013 | Topoulos |
| 2013/0172453 A1 | 7/2013 | Lee et al. |
| 2013/0217830 A1 | 8/2013 | Crawford et al. |
| 2013/0281587 A1 | 10/2013 | Shim et al. |
| 2014/0167088 A1 | 6/2014 | Lu |
| 2014/0167091 A1 | 6/2014 | Ogasawara et al. |
| 2014/0187662 A1 | 7/2014 | Lee et al. |
| 2014/0187700 A1 | 7/2014 | Lee et al. |
| 2014/0309356 A1 | 10/2014 | Kim et al. |
| 2014/0350163 A1 | 11/2014 | Kim et al. |
| 2017/0002196 A1 | 1/2017 | Park et al. |
| 2017/0037240 A1 | 2/2017 | Kim et al. |

FOREIGN PATENT DOCUMENTS

| | | |
|---|---|---|
| CN | 101550282 A | 10/2009 |
| CN | 101560325 A | 10/2009 |
| CN | 101597423 A | 12/2009 |
| CN | 101747602 A | 6/2010 |
| CN | 102725349 A | 10/2012 |
| CN | 102838849 A | 12/2012 |
| CN | 103270114 A | 8/2013 |
| CN | 103910979 A | 7/2014 |
| CN | 103911000 A | 7/2014 |
| DE | 19845317 A1 | 4/2000 |
| DE | 69829099 T2 | 12/2005 |
| DE | 10 2013 226 703 A1 | 7/2014 |
| EP | 0033393 A2 | 8/1981 |
| EP | 0114288 A2 | 8/1984 |
| EP | 0180417 A2 | 5/1986 |
| EP | 0246620 A2 | 5/1987 |
| EP | 0376616 A2 | 7/1990 |
| EP | 0528462 A1 | 2/1993 |
| EP | 0787769 A2 | 8/1997 |
| EP | 1010725 A2 | 6/2000 |
| EP | 2204412 A1 | 7/2010 |
| JP | 53-134799 A | 11/1978 |
| JP | 57-125241 A | 8/1982 |
| JP | 58-196250 A | 11/1983 |
| JP | 62-268612 A | 11/1987 |
| JP | 04-023856 A | 1/1992 |
| JP | 04-359954 A | 12/1992 |
| JP | 05-005055 | 1/1993 |
| JP | 05-098136 A | 4/1993 |
| JP | 05-125260 A | 5/1993 |
| JP | 05-194829 | 8/1993 |
| JP | 06-122771 A | 5/1994 |
| JP | 06-136212 A | 5/1994 |
| JP | 1994-200132 A | 7/1994 |
| JP | 06-313089 A | 11/1994 |
| JP | 07-026101 | 1/1995 |
| JP | 1995-228776 | 8/1995 |
| JP | 10-060241 A | 3/1998 |
| JP | 10-060242 A | 3/1998 |
| JP | 10-219026 A | 8/1998 |
| JP | 11-129246 A | 5/1999 |
| JP | 11-171984 A | 6/1999 |
| JP | 11-181168 A | 7/1999 |

(56) References Cited

FOREIGN PATENT DOCUMENTS

| | | |
|---|---|---|
| JP | 11-279385 | 10/1999 |
| JP | 2000-063641 A | 2/2000 |
| JP | 2000-204244 A | 7/2000 |
| JP | 2000-264959 A | 9/2000 |
| JP | 2000-265001 A | 9/2000 |
| JP | 2000-327992 | 11/2000 |
| JP | 2001-049072 A | 2/2001 |
| JP | 2002-080676 A | 3/2002 |
| JP | 2002-294070 A | 10/2002 |
| JP | 2003-525335 | 8/2003 |
| JP | 2003-313392 | 11/2003 |
| JP | 2004-075994 A | 3/2004 |
| JP | 4325753 | 12/2004 |
| JP | 2005-220173 A | 8/2005 |
| JP | 2006-249292 A | 9/2006 |
| JP | 2006-257284 A | 9/2006 |
| JP | 2006-342246 A | 12/2006 |
| JP | 2007-077222 | 3/2007 |
| JP | 2007-218980 | 8/2007 |
| JP | 2008-013702 A | 1/2008 |
| JP | 4915155 | 1/2008 |
| JP | 2009-507990 A1 | 2/2009 |
| JP | 2009-173015 A | 8/2009 |
| JP | 2011-094026 A | 5/2011 |
| JP | 2013-251510 A | 12/2013 |
| JP | 2014-148615 A | 8/2014 |
| KR | 10-1999-0018287 | 3/1993 |
| KR | 1996-0007611 B1 | 6/1996 |
| KR | 10-1998-0004915 | 6/1998 |
| KR | 10-1998-027070 | 7/1998 |
| KR | 1998-055579 | 9/1998 |
| KR | 10-1999-0029495 A | 4/1999 |
| KR | 10-1999-0054644 | 7/1999 |
| KR | 10-2000-0038719 A | 7/2000 |
| KR | 10-2000-0048033 A | 7/2000 |
| KR | 10-2001-0032100 A | 4/2001 |
| KR | 10-2001-0070975 A | 7/2001 |
| KR | 2004-0079118 A | 9/2004 |
| KR | 10-2005-0032100 A | 4/2005 |
| KR | 10-0514272 B | 9/2005 |
| KR | 10-2005-0109049 A | 11/2005 |
| KR | 10-0581437 B | 5/2006 |
| KR | 10-2006-0135649 A | 12/2006 |
| KR | 10-0709878 B1 | 4/2007 |
| KR | 10-2007-0070686 A | 7/2007 |
| KR | 10-2007-0072372 A | 7/2007 |
| KR | 10-2007-0072375 A | 7/2007 |
| KR | 10-2007-0093994 A | 9/2007 |
| KR | 10-0767428 A1 | 10/2007 |
| KR | 2007-7026437 A | 12/2007 |
| KR | 10-2008-0062975 A | 7/2008 |
| KR | 10-2008-0063054 A | 7/2008 |
| KR | 10-0871436 B1 | 11/2008 |
| KR | 10-2009-0030511 A | 3/2009 |
| KR | 10-0886348 B1 | 3/2009 |
| KR | 10-2010-0071715 | 6/2010 |
| KR | 10-2011-0078044 A | 7/2011 |
| KR | 10-2012-0066740 A | 6/2012 |
| KR | 10-2012-0140332 A | 12/2012 |
| KR | 10-2013-0076027 A | 7/2013 |
| KR | 10-2013-0076733 A | 7/2013 |
| KR | 10-2013-0116813 A | 10/2013 |
| KR | 10-2014-0075517 A | 6/2014 |
| TW | 201306319 | 2/2013 |
| TW | 201343743 A | 11/2013 |
| TW | 201343777 A | 11/2013 |
| WO | 02/088044 A1 | 11/2002 |
| WO | 2003/085029 A1 | 10/2003 |
| WO | 2005/075554 A1 | 8/2005 |
| WO | 2007/119920 A1 | 10/2007 |
| WO | 2007/140101 A1 | 12/2007 |
| WO | 2008/039017 A1 | 4/2008 |
| WO | 2008/081791 A1 | 7/2008 |
| WO | 2009/078593 A1 | 6/2009 |
| WO | 2009/078602 A1 | 6/2009 |
| WO | 2009/113762 A2 | 9/2009 |
| WO | 2009/116722 A1 | 9/2009 |
| WO | 2009/128601 A1 | 10/2009 |
| WO | 2010/143796 A1 | 12/2010 |
| WO | 2011/013882 A1 | 2/2011 |
| WO | 2012/081801 A1 | 6/2012 |
| WO | 2013/100578 A1 | 7/2013 |
| WO | 2013/101277 A1 | 7/2013 |
| WO | 2013/129201 A1 | 9/2013 |
| WO | 2015/102177 A1 | 7/2015 |

OTHER PUBLICATIONS

Office Action in commonly owned U.S. Appl. No. 12/642,904 dated Dec. 14, 2011, pp. 1-9.
European Search Report in commonly owned European Application No. 09180634 dated Feb. 2, 2010, pp. 1-3.
Xu, "Predicition of Refractive Indices of Linear Polymers by a four-descriptor QSPR model", Polymer, 45 (2004) pp. 8651-8659.
European Search Report in commonly owned European Application No. 10196806 dated Apr. 27, 2011, pp. 1-5.
European Search Report in commonly owned European Application No. 08873425.6 dated May 29, 2012, pp. 1-5.
International Search Report in commonly owned International Application No. PCT/KR2008/007157, dated May 28, 2009, pp. 1-2.
Office Action in commonly owned U.S. Appl. No. 12/792,176 dated Nov. 16, 2011, pp. 1-12.
International Search Report in commonly owned International Application No. PCT/KR2008/007825, dated Aug. 28, 2009, pp. 1-2.
Office Action in commonly owned U.S. Appl. No. 12/880,209 dated Feb. 16, 2011, pp. 1-10.
Final Office Action in commonly owned U.S. Appl. No. 12/880,209 dated Jul. 29, 2011, pp. 1-9.
Advisory Action in commonly owned U.S. Appl. No. 12/880,209 dated Nov. 4, 2011, pp. 1-4.
International Search Report in commonly owned International Application No. PCT/KR2008/007820 dated Jul. 28, 2009, pp. 1-2.
Final Office Action in commonly owned U.S. Appl. No. 12/792,176 dated Apr. 19, 2012, pp. 1-10.
International Search Report in commonly owned International Application No. PCT/KR2009/007944 dated Aug. 13, 2010, pp. 1-6.
Full English Translation of JP 04-359953, pp. 1-10.
Full English Translation of JP 04-359954, pp. 1-8.
International Search Report in commonly owned International Application No. PCT/KR2012/011485 dated Apr. 16, 2013, pp. 1-4.
Poly(cyclohexanedimethylene terephthalate), pp. 1-2, obtained online from http://www.polymerprocessing.com/polymers/PCT.html. No publication date given.
Office Action in commonly owned U.S. Appl. No. 14/367,416 dated Oct. 20, 2014, pp. 1-27.
Full Translation of Higuchi et al. JP 2007-218980, pp. 1-32.
Office Action in commonly owned U.S. Appl. No. 13/728,177 dated Oct. 23, 2013, pp. 1-7.
Office Action in commonly owned U.S. Appl. No. 13/728,177 dated Feb. 10, 2014, pp. 1-13.
Office Action in commonly owned U.S. Appl. No. 13/332,788 dated Nov. 28, 2012, pp. 1-8.
Final Office Action in commonly owned U.S. Appl. No. 13/332,788 dated Jul. 25, 2013, pp. 1-12.
Office Action in commonly owned U.S. Appl. No. 14/067,139 dated May 22, 2014, pp. 1-8.
International Search Report in commonly owned International Application No. PCT/KR2011/006328 dated Apr. 4, 2012, pp. 1-4.
Office Action in commonly owned U.S. Appl. No. 13/915,655 dated Mar. 5, 2014, pp. 1-7.
Notice of Allowance in commonly owned U.S. Appl. No. 13/728,177 dated May 30, 2014, pp. 1-5.
Final Office Action in commonly owned U.S. Appl. No. 13/915,655 dated Jun. 23, 2014, pp. 1-5.
Notice of Allowance in commonly owned U.S. Appl. No. 13/915,655 dated Oct. 15, 2014, pp. 1-7.
Office Action in commonly owned Korean Application No. 10-2014-0182421 dated Jan. 26, 2017, pp. 1-5.

(56) References Cited

OTHER PUBLICATIONS

Wypych, "2.1.67 Wollastonite," Handbook of Fillers, 3d Ed., pp. 151-152, Toronto, Ontario: ChemTec Publishing (2010).
Office Action in commonly owned Korean Application No. 10-2014-0138130 dated Nov. 16, 2016, pp. 1-5.
Office Action in commonly owned U.S. Appl. No. 14/971,348 dated Apr. 14, 2017, pp. 1-15.
Office Action in commonly owned Chinese Application No. 201510633614.8 dated Dec. 12, 2016, pp. 1-7.
Office Action in commonly owned U.S. Appl. No. 14/044,906 dated Sep. 15, 2014, pp. 1-6.
Notice of Allowance in commonly owned U.S. Appl. No. 14/044,906 dated Dec. 29, 2014, pp. 1-6.
Office Action in commonly owned U.S. Appl. No. 13/332,736 dated Sep. 17, 2013, pp. 1-7.
Notice of Allowance in commonly owned U.S. Appl. No. 13/332,736 dated Apr. 17, 2014, pp. 1-8.
Office Action in commonly owned U.S. Appl. No. 14/102,535 dated Sep. 26, 2014, pp. 1-8.
Office Action in commonly owned U.S. Appl. No. 14/552,765 dated Sep. 26, 2016, pp. 1-8.
Office Action in commonly owned Taiwanese Application No. 104132047 dated Jun. 4, 2016, pp. 1-7.
Office Action in commonly owned U.S. Appl. No. 14/862,467 dated Nov. 8, 2016, pp. 1-8.
Office Action in commonly owned Chinese Application No. 201510359435.X dated Jun. 17, 2016, pp. 1-7.
Office Action in commonly owned U.S. Appl. No. 14/552,765 dated May 10, 2017, pp. 1-8.
Office Action in commonly owned German Application No. 102014224495.1 dated Feb. 15, 2017, pp. 1-8.
Office Action in commonly owned Chinese Application No. 201510946837.X dated Mar. 3, 2017, pp. 1-10.
Final Office Action in commonly owned U.S. Appl. No. 14/862,467 dated May 30, 2017, pp. 1-13.
Office Action in commonly owned U.S. Appl. No. 14/748,879 dated May 25, 2017, pp. 1-15.
Office Action in commonly owned Chinese Patent Application No. 201610520653.1 dated May 19, 2017, pp. 1-7.
International Search Report in commonly owned International Application No. PCT/KR2014/005080 dated Sep. 26, 2014, pp. 1-4.
Office Action in commonly owned U.S. Appl. No. 15/107,210 dated Sep. 18, 2017, pp. 1-9.
Office Action in commonly owned Chinese Application No. 201480071500.2 dated Jan. 25, 2017, pp. 1-7.
Final Office Action in commonly owned U.S. Appl. No. 14/748,879 dated Nov. 1, 2017, pp. 1-17.
Notice of Allowance in commonly owned U.S. Appl. No. 14/862,467 dated Aug. 8, 2017, pp. 1-7.
Final Office Action in commonly owned U.S. Appl. No. 14/552,765 dated Dec. 13, 2017, pp. 1-10.
Office Action in counterpart Korean Application No. 10-2015-0093747 dated Apr. 14, 2017, pp. 1-6.
Office Action in commonly owned Korean Application No. 10-2015-0078825 dated Mar. 29, 2017, pp. 1-6.
Office Action in commonly owned Japanese Application No. 2016-543678 dated Dec. 26, 2017, pp. 1-4.

Turner et al., "Cyclohexanedimethoanol Polyester", vol. 2, 2001, pp. 127-134.
Office Action in commonly owned U.S. Appl. No. 14/971,348 dated Mar. 8, 2019, pp. 1-10.
Devaney, R., "The structure and electrical properties of poly(1,4-cyclohexylenedimethylene terephthalate), a new linear thermoplastic polyester," National Academy of Sciences—National Research Council, vol. 1080, pp. 32-35 (Year 1963).
Taiwanese Office Action in commonly owned Taiwanese Application No. 96136059 dated May 5, 2011, pp. 1-9.
English Translation of Taiwanese Office Action in commonly owned Taiwanese Application No. 96136059 dated May 5, 2011, pp. 1-5.
European Search Report in commonly owned European Application No. 07808474 dated Sep. 28, 2011, pp. 1-4.
International Preliminary Report on Patentability in commonly owned International Application No. PCT/KR2007/004743, dated Mar. 31, 2009, pp. 1-5.
International Search Report in commonly owned International Application No. PCT/KR2007/004743, dated Jan. 4, 2008, pp. 1-2.
Office Action in commonly owned U.S. Appl. No. 12/413,630 dated Jun. 23, 2009, pp. 1-9.
Final Office Action in commonly owned U.S. Appl. No. 12/413,630 dated Dec. 7, 2009, pp. 1-9.
Advisory Action in commonly owned U.S. Appl. No. 12/413,630 dated Apr. 9, 2010, pp. 1-3.
French Search Report and Written Opinion in commonly owned French Application No. 0959193 dated May 27, 2010, pp. 1-5.
Office Action in commonly owned U.S. Appl. No. 12/640,343 dated Aug. 29, 2011, pp. 1-7.
Office Action in commonly owned U.S. Appl. No. 12/640,343 dated Feb. 22, 2012, pp. 1-13.
Final Office Action in commonly owned U.S. Appl. No. 12/640,343 dated Jun. 5, 2012, pp. 1-12.
Office Action in commonly owned U.S. Appl. No. 12/641,752 dated Jan. 10, 2011, pp. 1-10.
Notice of Allowance in commonly owned U.S. Appl. No. 12/641,752 dated Jul. 20, 2011, pp. 1-9.
International Search Report in commonly owned International Application No. PCT/KR2009/007917 dated Aug. 24, 2010, pp. 1-9.
English-translation of Abstract for Korean Publication No. 1998-055579, published Sep. 25, 1998, pp. 1.
Igranox 1076, SpecialChem, Ciba, now part of BASF, 2012 Retrieved online<http://www.specialchem4adhesives.com>, pp. 1.
Office Action in commonly owned U.S. Appl. No. 13/362,068 dated Apr. 6, 2012, pp. 1-24.
Chinese Search Report in commonly owned Chinese Application No. 200980159831.0 dated Dec. 17, 2012, pp. 1-2.
Office Action in commonly owned U.S. Appl. No. 13/300,746 dated Jul. 31, 2013, pp. 1-14.
Advisory Action in commonly owned U.S. Appl. No. 13/300,746 dated Mar. 22, 2013, pp. 1-7.
Office Action in commonly owned U.S. Appl. No. 13/300,746 dated Apr. 9, 2012, pp. 1-19.
Office Action in commonly owned U.S. Appl. No. 13/300,746 dated Sep. 11, 2012, pp. 1-20.
Final Office Action in commonly owned U.S. Appl. No. 13/300,746 dated Jan. 3, 2013, pp. 1-14.
Final Office Action in commonly owned U.S. Appl. No. 13/300,746 dated Jan. 8, 2013, pp. 1-14.
Office Action in commonly owned U.S. Appl. No. 14/367,416 dated Mar. 4, 2015, pp. 1-35.

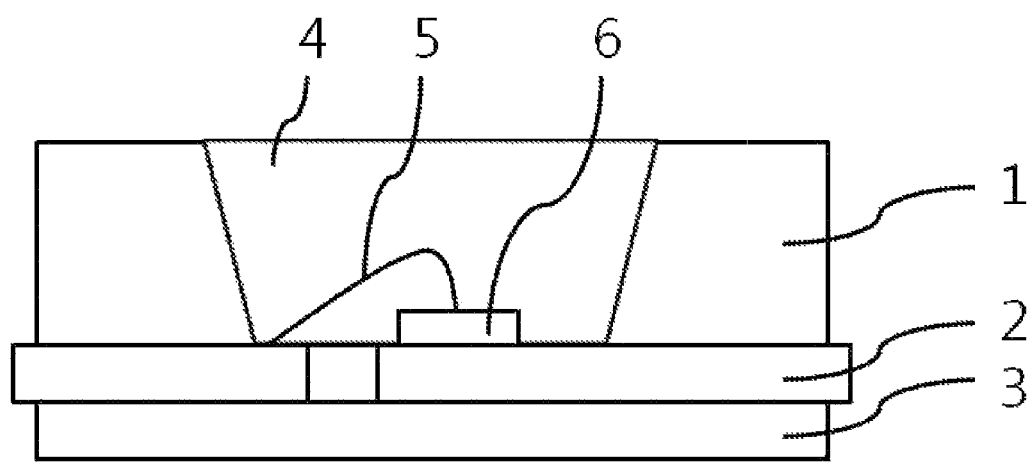

POLYESTER RESIN COMPOSITION WITH EXCELLENT IMPACT RESISTANCE AND LIGHT RELIABILITY AND MOLDED ARTICLE USING THE SAME

CROSS-REFERENCE TO RELATED APPLICATION

This application is a continuation of U.S. application Ser. No. 15/195,128, filed on Jun. 28, 2016, pending, and claims priority under 35 USC Section 119 to and the benefit of Korean Patent Application No. 10-2015-0093747, filed on Jun. 30, 2015, in the Korean Intellectual Property Office, the entire disclosure of each of which is incorporated herein by reference.

FIELD OF THE INVENTION

The present invention relates to a polyester resin composition and a molded article produced using the same.

BACKGROUND

Recently, polyester resins have been used as a material for components of a light emitting diode (LED). LEDs have rapidly replaced conventional light sources due to their excellent energy efficiency and long lifespan. Such an LED uses a polyester resin as a material for components such as a reflector, a reflector cup, a scrambler, and a housing.

An LED generally includes a light emitting semiconductor component, a wire, a housing, a reflector, and a transparent encapsulation member encapsulating the semiconductor component. Thereamong, the reflector can be formed of ceramics or heat resistant plastics. However, ceramics have poor productivity and heat resistant plastics suffer from deterioration in reflectance upon injection molding, heat-curing of an encapsulation member, or use under actual environmental conditions.

Conventionally, a polyphthalamide (PPA) resin, which is a heat resistant nylon resin having higher heat resistance than typical nylon resins, has mainly been used in a reflector for LEDs. However, such a heat resistant nylon resin suffers from significant degradation and color non-uniformity upon long term use of an LED, causing deterioration in performance of a product.

In order to overcome these problems, a modified polyester resin can be used instead of a PPA resin. Such a modified polyester resin is a polyester resin which includes glass fibers as a reinforcing agent and contains a benzene ring in a polyester backbone, and has higher heat resistance than typical polyester resins. Addition of a reinforcing agent can improve stiffness but also can reduce impact resistance. Thus, an additive for improving impact strength is commonly introduced. However, when such an additive is introduced into a typical polyester resin, the polyester resin can exhibit poor crystallinity, which can make injection molding at high temperature impossible or difficult.

Particularly, with design diversification and reduction in thickness of a reflector for LEDs, there is an urgent need for a polyester resin having improved impact strength so as to avoid brittleness during fabrication of an LED package. Japanese Patent Publication No. 1994-200132 A discloses a resin composition for lamp reflectors including a polyester resin and glass fibers; Japanese Patent No. 4,915,155 discloses a light reflective resin composition including an aromatic polycarbonate resin and a cycloaliphatic polyester resin; and Japanese Patent No. 4,325,753 discloses a light reflective polyester resin composition mainly composed of aliphatic polyester. However, these resin compositions cannot secure sufficient impact resistance or reliability of a reflector for LEDs.

Therefore, there is a need for a resin composition which can secure optical reliability while exhibiting excellent impact resistance and thus can be suitably used in an LED reflector.

SUMMARY OF THE INVENTION

Embodiments provide a polyester resin composition which can have excellent properties in terms of impact resistance and optical reliability by employing two polyester resins having different trans/cis isomer ratios as a base resin, and a molded article produced using the same. For example, the present invention can provide a polyester resin composition which can have excellent impact resistance and optical reliability under high temperature conditions for a long period of time, and a molded article produced using the same.

Embodiments provide a polyester resin composition which can exhibit increased crystallinity by mixing two polyester resins having different trans/cis isomer ratios with a white pigment and at least one inorganic filler in an optimal amount ratio and thus can be easily injection molded at high temperature, and a molded article produced using the same.

The polyester resin composition can include: (A) two polyester resins each containing an aliphatic ring structure and having different trans/cis isomer ratios in the aliphatic ring; (B) a white pigment; and (C) an inorganic filler, wherein the polyester resin composition has a crystallization temperature (Tc) of about 230° C. to about 250° C., as measured by differential scanning calorimetry (DSC) while cooling the resin composition at a cooling rate of −100° C./min.

The two polyester resins (A) may be (A-1) a first polyester resin having a trans/cis isomer ratio of about 2.5 or higher; and (A-2) a second polyester resin having a trans/cis isomer ratio of less than about 2.5.

The polyester resin composition may further include (D) an impact modifier.

The first polyester resin (A-1) may have a trans/cis isomer ratio of about 2.5 to about 3.0, and the second polyester resin (A-2) may have a trans/cis isomer ratio of about 1.8 to less than about 2.5.

The polyester resin composition may include: about 10 wt % to about 40 wt % of the first polyester resin (A-1); about 10 wt % to about 40 wt % of the second polyester resin (A-2); about 10 wt % to about 60 wt % of the white pigment (B); and about 5 wt % to about 40 wt % of the inorganic filler (C).

Each of the first polyester resin (A-1) and the second polyester resin (A-2) may include a poly(1,4-cyclohexylene dimethylene terephthalate) (PCT) resin represented by Formula 1:

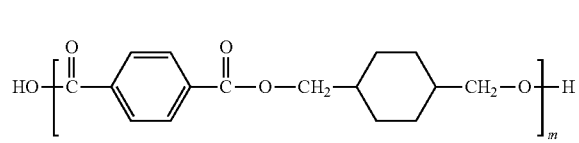

wherein m is an integer from 50 to 500.

A weight ratio of the first polyester resin (A-1) to the second polyester resin (A-2) may range from about 1:4 to about 4:1.

A total amount of the first polyester resin (A-1) and the second polyester resin (A-2) may range from about 30 wt % to about 70 wt % based on the total weight of (A), (B), and (C).

Each of the first polyester resin (A-1) and the second polyester resin (A-2) may have an intrinsic viscosity (η) of about 0.4 dl/g to about 1.5 dl/g, as measured in an o-chlorophenol solution at 25° C.

The white pigment (B) may include at least one of titanium oxide, zinc oxide, zinc sulfide, white lead, zinc sulfate, barium sulfate, calcium carbonate, and/or aluminum oxide.

The white pigment (B) may be titanium oxide, and the titanium oxide may have an average particle diameter of about 0.05 μm to about 2.0 μm.

The inorganic filler (C) may include (C-1) a first inorganic filler and (C-2) a second inorganic filler, wherein the first inorganic filler (C-1) may be glass fibers and the second inorganic filler (C-2) may be wollastonite.

A weight ratio of the first inorganic filler (C-1) to the second inorganic filler (C-2) may range from about 1:3 to about 3:1.

The polyester resin composition may further include at least one additive selected from among antioxidants, photostabilizers, fluorescent brighteners, antistatic agents, release agents, heat stabilizers, dyes, nucleating agents, plasticizers, admixtures, colorants, stabilizers, lubricants, and/or flame retardants.

Other embodiments of the present invention relate to a molded article produced using the polyester resin composition as set forth above.

The molded article may be a reflector for LEDs.

The molded article may have an Izod impact strength of about 15 kgf·cm/cm to about 20 kgf·cm/cm, as measured on a ⅛" thick unnotched Izod specimen in accordance with ASTM D256, and an initial reflectance ($R_0$) of about 90% or higher, as measured at a wavelength of 450 nm using a colorimeter.

The molded article may have a reflectance retention rate of about 85% to about 99%, as calculated by Equation 1:

$$\text{Reflectance retention rate } (R_V) \, (\%) = \{(R_1/R_0)\} \times 100 \quad (1),$$

wherein $R_0$ is initial reflectance of the molded article as measured at a wavelength of 450 nm using a colorimeter, and $R_1$ is reflectance of the molded article after irradiation at a wavelength of 450 nm for 1,000 hours using an LED light source in a thermos-hygrostat oven at 85° C./85% relative humidity (RH).

According to the present invention, the polyester resin composition can exhibit excellent properties in terms of impact resistance and optical reliability.

In addition, according to the present invention, the polyester resin composition can have high crystallinity and thus low water permeability, thereby allowing easy injection molding at high temperature while maintaining high reflectance so as to secure excellent optical reliability.

BRIEF DESCRIPTION OF DRAWINGS

FIG. 1 is a sectional view of a semiconductor device including a reflector formed of a polyester resin composition according to one embodiment of the invention.

DETAILED DESCRIPTION

The above and other aspects, features, and advantages of the present invention will become apparent from the detailed description of the following embodiments in conjunction with the accompanying drawings. It should be understood that the present invention is not limited to the following embodiments and may be embodied in different ways, and that the embodiments are provided for complete disclosure and thorough understanding of the present invention by those skilled in the art. The scope of the present invention should be defined only by the appended claims.

Unless otherwise defined herein, all terms including technical or scientific terms used herein have the same meanings as commonly understood by those skilled in the art to which the present invention pertains. It will be further understood that terms, such as those defined in commonly used dictionaries, should not be interpreted in an idealized or overly formal sense unless expressly so defined herein.

The present invention relates to a polyester resin composition and a molded article produced using the same. The polyester resin composition can exhibit excellent properties in terms of impact resistance and optical reliability by employing two polyester resins each including an aliphatic ring structure and having different trans/cis isomer ratios in the aliphatic ring as a base resin and including a white pigment and at least one inorganic filler.

The polyester resin composition has a crystallization temperature (Tc) of about 230° C. to about 250° C., as measured by differential scanning calorimetry (DSC) while cooling the resin composition at a cooling rate of −100° C./min.

In exemplary embodiments, two polyester resins (A) may include (A-1) a first polyester resin having a trans/cis isomer ratio of about 2.5 or higher and (A-2) a second polyester resin having a trans/cis isomer rate of less than about 2.5.

In another embodiment, the first polyester resin (A-1) may have a trans/cis isomer ratio of about 2.5 to about 3.0, and the second polyester resin (A-2) may have a trans/cis isomer ratio of about 1.8 to less than about 2.5.

Hereinafter, each component of the polyester resin composition according to the present invention will be described in detail.

(A) Polyester Resin

In the present invention, the (A) polyester resin used as a base resin may be a highly crystalline engineering plastic suitable for use in a reflector for LEDs. This is aimed at solving problems of difficulty in curing and injection molding due to use of a typical impact modifier composed of a rubbery polymer. When such a highly crystalline engineering plastic is used as the (A) polyester resin, it is possible to increase crystallinity of the polyester resin composition, thereby allowing injection molding at high temperature while maintaining high light reflectance. The polyester resin composition can become more compact and can exhibit lower water permeability with increasing crystallinity of the resin composition, and thus can be used under high temperature and high humidity conditions for a long time, thereby securing optical reliability.

A polyester resin mainly used as an engineering plastic is an aromatic polyester resin. In exemplary embodiments, an aromatic polyester resin may be used as the polyester resin, which is a base resin. The aromatic polyester resin may be prepared through polycondensation of a dicarboxylic acid component with a diol component. For example, the aromatic polyester resin may include a polymer of a dicarboxylic acid component including an aromatic dicarboxylic acid and a diol component including cycloaliphatic diols having different trans/cis isomer ratios.

The dicarboxylic acid component may include one or more aromatic dicarboxylic acids and/or derivatives thereof.

Examples of the dicarboxylic acid component may include without limitation terephthalic acid, isophthalic acid, phthalic acid, naphthalene dicarboxylic acid, and the like, and mixtures thereof. For example, terephthalic acid may be used as the dicarboxylic acid component. When these compounds are used as the dicarboxylic acid component, the polyester resin composition can exhibit improved properties in terms of crystallinity, light reflectance, and/or optical reliability.

The diol component may include a cycloaliphatic diol having cyclic repeat units. For example, 1,4-cyclohexanedimethanol (CHDM) may be used as the diol component. When cycloaliphatic diols are used as the diol component, the polyester resin composition can exhibit further improved properties in terms of crystallinity, light reflectance, and/or optical reliability.

The aromatic polyester resin includes a first polyester resin and a second polyester resin each having an aliphatic ring structure and having different trans/cis isomer ratios in the aliphatic ring. When the aromatic polyester resin includes the first polyester resin and the second polyester, the polyester resin composition can exhibit excellent properties in terms of crystallinity, light reflectance, and/or optical reliability.

As used herein, the term "trans/cis isomer ratio" refers to a ratio of trans isomer to cis isomer (trans isomer/cis isomer) in the aliphatic ring structure originating from the diol component of the polyester resin.

The first polyester resin may have a trans/cis isomer ratio in the aliphatic ring structure of about 2.5 or higher, for example about 2.5 to about 3.0. For example, in some embodiments, the first polyester resin may have a trans/cis isomer ratio in the aliphatic ring structure of 2.5, 2.6, 2.7, 2.8, 2.9, or 3.0. Within this range, the polyester resin composition can have improved properties in terms of crystallinity, light reflectance, and/or optical reliability.

The second polyester resin has a trans/cis isomer ratio in the aliphatic ring structure that is different from, and less than, the trans/cis isomer ratio in the aliphatic ring structure of the first polyester resin. The second polyester resin may have a trans/cis isomer ratio in the aliphatic ring structure of less than about 2.5, for example about 1.8 to less than about 2.5. For example, in some embodiments, the second polyester resin may have a trans/cis isomer ratio in the aliphatic ring structure of 1.8, 1.9, 2.0, 2.1, 2.2, 2.3, or 2.4. Within this range, the polyester resin composition can exhibit excellent properties in terms of crystallinity, light reflectance, and/or optical reliability.

When both the first polyester resin (A-1) and the second polyester resin (A-2) are used as the aromatic polyester resin, the number of trans isomers in the resin is increased, thereby increasing crystallinity of the resin. Particularly, the first polyester resin (A-1) serves to increase crystallization temperature (Tc) and thus crystallization rate to provide high crystallinity to the polyester resin, such that the polyester resin can be easily subjected to injection molding at high temperature, avoid water permeation, and/or exhibit high optical reliability when used under high temperature and high humidity conditions for a long time. The second polyester resin (A-2) serves to improve physical properties of the polyester resin (A), thereby preventing brittleness of the resin.

In exemplary embodiments, each of the two polyester resins (A) may include a poly(1,4-cyclohexylene dimethylene terephthalate) (PCT) resin obtained through polycondensation of terephthalic acid with 1,4-cyclohexane dimethanol and represented by Formula 1:

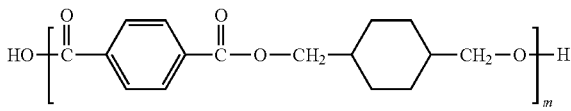

wherein m is an integer from 50 to 500.

When each of the two polyester resins includes the PCT resin, the polyester resin composition can exhibit further improved properties in terms of crystallinity, light reflectance, and/or optical reliability.

The diol component of the polyester resin may further optionally include ethylene glycol (EG), which is an aliphatic diol, in addition to 1,4-cyclohexane dimethanol. When ethylene glycol is included, the diol component may include about 15 mol % to 100 mol % of 1,4-cyclohexane dimethanol and 0 mol % to about 85 mol % of ethylene glycol, for example about 30 mol % to about 80 mol % of 1,4-cyclohexane dimethanol and about 20 mol % to about 70 mol % of ethylene glycol, based on the total mole number (100 mol %) of the diol component.

In some embodiments, the diol component of the polyester resin can include 1,4-cyclohexane dimethanol in an amount of about 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 mol %. Further, according to some embodiments, the amount of 1,4-cyclohexane dimethanol can be in a range from about any of the foregoing amounts to about any other of the foregoing amounts.

In some embodiments, the diol component of the polyester resin can include ethylene glycol in an amount of 0 (ethylene glycol is not present), about 0 (ethylene glycol is present), 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, or 85 mol %. Further, according to some embodiments, the amount of ethylene glycol can be in a range from about any of the foregoing amounts to about any other of the foregoing amounts.

With this range of ethylene glycol, the diol component can provide impact resistance with minimal or no deterioration in heat resistance of the polyester resin.

In addition, at least one $C_6$ to $C_{21}$ aromatic diol and/or $C_3$ to $C_8$ aliphatic diol may be further included in the diol component to modify the polyester resin (A). Here, when present, the $C_6$ to $C_{21}$ aromatic diol and/or the $C_3$ to $C_8$ aliphatic diol may be optionally present in an amount of about 3 mol % or less (for example in an amount greater than 0 mol % to about 3 mol %) based on the total mole number (100 mol %) of the diol component. Examples of the $C_6$ to $C_{21}$ aromatic diol and/or the $C_3$ to $C_8$ aliphatic diol may include without limitation propane-1,3-diol, butane-1,4-diol, pentane-1,5-diol, hexane-1,6-diol, 3-methylpentane-2,4-diol, 2-methylpentane-1,4-diol, 2,2,4-trimethylpentane-1,3-diol, 2-ethylhexane-1,3-diol, 2,2-diethylpropane-1,3-diol, 1,4-cyclobutanedimethanol, 2,2-bis-(3-hydroxyethoxyphenyl)-propane, 2,2-bis-(4-hydroxypropoxyphenyl)-propane, and the like. These compounds may be used alone or as a mixture thereof.

Each of the two polyester resins (A) may have an intrinsic viscosity (η) of about 0.4 dl/g to about 1.5 dl/g, as measured in an o-chlorophenol solution at 25° C. For example, each of the two polyester resins (A) may have an intrinsic viscosity (η) of 0.5 dl/g, 0.6 dl/g, 0.7 dl/g, 0.8 dl/g, 0.9 dl/g, 1.0 dl/g, or 1.1 dl/g. Within this range, the polyester resin composition can exhibit improved mechanical properties and/or moldability.

Each of the two polyester resins (A) may have a weight average molecular weight of about 3,000 g/mol to about 30,000 g/mol, for example, about 5,000 g/mol to about 20,000 g/mol, as measured by gel permeation chromatography (GPC). Within this range, the polyester resin composition can exhibit excellent moldability and/or mechanical properties.

Each of the two polyester resins (A) includes a cyclic structure in a polymer backbone and thus has a high melting point. Each of the two polyester resins (A) may have a melting point of about 200° C. or higher, for example, about 220° C. to about 380° C., and as another example about 260° C. to about 320° C.

The polyester resins (A) may be prepared through a typical polycondensation reaction known in the art. Here, the polycondensation reaction may include direct polycondensation of an acid through transesterification using glycol or lower alkyl ester.

The polyester resin composition can include the first polyester resin (A-1) in an amount of about 10 wt % to about 40 wt %, based on the total weight (100 wt %) of the polyester resin composition. In some embodiments, the polyester resin composition can include the first polyester resin (A-1) in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the first polyester resin (A-1) can be present in an amount of from about any of the foregoing amounts to about any other of the foregoing amounts.

The polyester resin composition can include the second polyester resin (A-2) in an amount of about 10 wt % to about 40 wt %, based on the total weight (100 wt %) of the polyester resin composition. In some embodiments, the polyester resin composition can include the second polyester resin (A-2) in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the second polyester resin (A-2) can be present in an amount of from about any of the foregoing amounts to about any other of the foregoing amounts.

The polyester resin composition can include a total amount of the first polyester resin and the second polyester resin of from about 30 wt % to about 70 wt %, for example about 40 wt % to about 65 wt %, based on the total weight (100 wt %) of (A), (B), and (C). In some embodiments, the polyester resin composition can include a total amount of the first polyester resin and the second polyester resin of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the first polyester resin and the second polyester resin can be present in a total amount of from about any of the foregoing amounts to about any other of the foregoing amounts.

In addition, the polyester resin composition may include the first polyester resin (A-1) and the second polyester resin (A-2) in a weight ratio of about 1:4 to about 4:1, for example about 1:3.5 to about 3.5:1, for example, about 1:0.25, about 1:0.5, about 1:0.8, about 1:1.25, or about 1:2. Within this range, the polyester resin composition can maintain a high level of crystallinity, thereby facilitating injection molding at high temperature while minimizing reduction in light reflectance upon long term use under high temperature and high humidity conditions when used as a material for an LED reflector.

(B) White Pigment

The white pigment (B) can serve to provide sufficient reflectivity, and the kind of the white pigment is not particularly limited. Examples of the white pigment may include without limitation titanium oxide, zinc oxide, zinc sulfide, white lead, zinc sulfate, barium sulfate, calcium carbonate, aluminum oxide, and the like. These compounds may be used alone or in combination thereof.

In exemplary embodiments, titanium oxide ($TiO_2$) may be used as the white pigment. Titanium oxide can improve optical properties such as reflectivity and concealment. The titanium oxide may be prepared by any suitable method known in the art or may be any commercially available product. In exemplary embodiments, rutile type titanium oxide can be used. Titanium oxide may have an average particle diameter of about 0.05 μm to about 2.0 μm, for example, about 0.05 μm to about 0.7 μm.

The white pigment may be treated with a silane coupling agent and/or a titanium coupling agent, for example a silane coupling agent. Examples of the silane coupling agent may include without limitation vinyltriethoxysilane, 3-aminopropyltriethoxysilane, 3-glycidoxypropyltriethoxysilane, and the like, and mixtures thereof.

When used as the white pigment, the titanium oxide may be treated with an inorganic surface treatment agent and/or an organic surface treatment agent. Examples of the inorganic surface treatment agent may include without limitation aluminum oxide (alumina, $Al_2O_3$), silicon dioxide (silica, $SiO_2$), zirconium dioxide (zirconia, $ZrO_2$), sodium silicate, sodium aluminate, sodium aluminum silicate, zinc oxide, mica, and the like. These compounds may be used alone or as a mixture thereof. Examples of the organic surface treatment agent may include without limitation polydimethylsiloxane, trimethylpropane (TMP), pentaerythritol, and the like. These compounds may be used alone or as a mixture thereof. The surface treatment agent may be used in an amount of 5 parts by weight or less based on about 100 parts by weight of titanium oxide.

The polyester resin composition can include the white pigment (B) in an amount of about 10 wt % to about 60 wt %, for example about 30 wt % to about 40 wt %, based on the total weight (100 wt %) of the polyester resin composition. In some embodiments, the polyester resin composition can include the white pigment (B) in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 wt %. Further, according to some embodiments of the present invention, the white pigment (B) can be present in an amount of from about any of the foregoing amounts to about any other of the foregoing amounts.

Within this range, the polyester resin composition can exhibit further improved light resistance and/or impact resistance.

(C) Inorganic Filler

The inorganic filler (C) according to the present invention may include at least one (inclusive of at least two) inorganic filler, and may include an inorganic filler other than (that is different from) the white pigment (B).

In exemplary embodiments, the inorganic filler (C) may include (C-1) a first inorganic filler and (C-2) a second inorganic filler. The inorganic filler (C) can serve to improve mechanical properties and heat resistance of the polyester resin composition to secure good moldability.

The first inorganic filler (C-1) can include fibrous inorganic fillers, for example glass fibers. The glass fibers can improve moldability of the polyester resin composition while allowing a molded article produced using the polyester resin composition to have improved mechanical properties such as tensile strength, flexural strength, and/or flexural modulus and/or heat resistance properties such as heat deflection temperature. The glass fibers may be added to overcome difficulty in injection molding due to brittleness of the polyester resin, which is a base resin.

Although the present invention is not limited to a particular kind of glass fibers, the glass fibers may have an average length of about 0.1 mm to about 20 mm, for example about 3.5 mm to about 10 mm, an average diameter of about 5 μm to about 20 μm, for example about 6.5 μm to about 13 μm, and an aspect ratio of about 20 to about 1,500. The glass fibers having an aspect ratio in the above range can significantly improve impact resistance of the polyester resin composition. The glass fibers may have a circular, elliptical, and/or quadrilateral shape in cross-section. However, it should be understood that the present invention is not limited thereto and the glass fibers may have a variety of shapes depending upon desired applications.

Although the present invention is not limited to a particular kind of second inorganic filler (C-2), the second inorganic filler may be a needle-like inorganic filler. For example, the second inorganic filler (C-2) may include mineral fillers such as wollastonite, mica, and/or whiskers.

In exemplary embodiments, wollastonite may be used as the second inorganic filler. Wollastonite is a white needle-like mineral based on calcium. Wollastonite may have an average particle diameter of about 1 μm to about 60 μm, for example about 3 μm to about 40 μm, and an average aspect ratio of about 6 or greater, for example about 7 to about 20. Within this range, the polyester resin composition can have further improved injection moldability.

The polyester resin composition can include the first inorganic filler (C-1) in an amount of about 5 wt % to about 40 wt %, for example about 10 wt % to about 20 wt %, based on the total weight (100 wt %) of the polyester resin composition. In some embodiments, the polyester resin composition can include the first inorganic filler (C-1) in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the first inorganic filler (C-1) can be present in an amount of from about any of the foregoing amounts to about any other of the foregoing amounts.

Within this range, the polyester resin composition can exhibit improved moldability, mechanical properties, and/or heat resistance properties.

The polyester resin composition can include the second inorganic filler (C-2) in an amount of about 5 wt % to about 40 wt %, for example about 10 wt % to about 20 wt %, based on the total weight (100 wt %) of the polyester resin composition. In some embodiments, the polyester resin composition can include the second inorganic filler (C-2) in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the second inorganic filler (C-2) can be present in an amount of from about any of the foregoing amounts to about any other of the foregoing amounts.

Within this range, the polyester resin composition can exhibit further improved moldability, mechanical properties, and/or heat resistance properties.

In the polyester resin composition, a weight ratio of the first inorganic filler (C-1) to the second inorganic filler (C-2) may range from about 1:3 to about 3:1, for example about 1:1 to about 1:2. Within this range, the polyester resin composition can exhibit further improved moldability, mechanical properties, and/or heat resistance properties.

The polyester resin composition can include a total amount of the first inorganic filler (C-1) and the second inorganic filler (C-2) of from about 5 wt % to about 40 wt % based on the total weight (100 wt %) of the polyester resin composition. In some embodiments, the polyester resin composition can include the first inorganic filler (C-1) and the second inorganic filler (C-2) in a total amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the first inorganic filler (C-1) and the second inorganic filler (C-2) can be present in a total amount of from about any of the foregoing amounts to about any other of the foregoing amounts.

Within this range, the polyester resin composition can exhibit further improved moldability, mechanical properties, and/or heat resistance properties.

(D) Impact Modifier

The impact modifier serves to improve compatibility with the polyester resin and dispersibility of the components of the resin composition, thereby securing high light reflectance and/or impact resistance.

For example, the impact modifier may be an acrylic copolymer. In exemplary embodiments, the acrylic copolymer may include a copolymer of ethylene and alkyl(meth)acrylate.

Examples of the alkyl(meth)acrylate may include without limitation methyl acrylate, ethyl acrylate, butyl acrylate, 2-ethylbutyl acrylate, 2-ethylhexyl (meth)acrylate, hexyl acrylate, heptyl acrylate, octyl acrylate, n-pentyl acrylate, vinyl acrylate, lauryl acrylate, methyl methacrylate, ethyl methacrylate, butyl methacrylate, 2-ethylbutyl methacrylate, 2-ethylhexyl methacrylate, lauryl methacrylate, methyl ethacrylate, ethyl ethacrylate, and the like, and mixtures thereof.

The impact modifier may include about 25 wt % to about 35 wt % of an alkyl(meth)acrylate monomer. In addition, the impact modifier may include about 15 wt % to about 45 wt % of an acryl group. Within this range, the polyester resin composition can improve flowability and/or compatibility, and/or can reduce stress upon processing, thereby improving moldability.

The impact modifier may have a melting point of about 50° C. to about 70° C. Within this range, it is possible to enhance flowability and/or compatibility of the resin and/or to reduce stress during processing, thereby improving moldability.

The impact modifier may have a weight average molecular weight of about 90 g/mol to about 150 g/mol, for example about 100 g/mol to about 140 g/mol. Within this range, it is possible to improve compatibility with the polyester resin and/or dispersibility of the white pigment.

The polyester resin composition can include the impact modifier in an amount of about 0.1 parts by weight to about 10 parts by weight based on about 100 parts by weight of (A)+(B)+(C). In some embodiments, the polyester resin composition can include the impact modifier in an amount of about 0.1, 0.2, 0.3, 0.4, 0.5, 0.6, 0.7, 0.8, 0.9, 1, 2, 3, 4, 5, 6, 7, 8, 9, or 10 parts by weight. Further, according to some embodiments of the present invention, the impact modifier can be present in an amount of from about any of the foregoing amounts to about any other of the foregoing amounts.

Within this range, the impact modifier can exhibit further improved synergistic effect in combination with other components while providing further improved discoloration resistance and/or optical stability.

The polyester resin composition according to the present invention may further include one or more of a typical additive without altering advantageous effects of the invention. Examples of the additive may include without limitation at least one of antioxidants, photostabilizers, fluorescent brighteners, antistatic agents, release agents, heat stabilizers, dyes, nucleating agents, plasticizers, admixtures, colorants, stabilizers, lubricants, flame retardants, and the like, and mixtures thereof. The additive may be present in an amount of about 20 parts by weight or less (for example, greater than 0 to about 20 parts by weight) based on about 100 parts by weight of the polyester resin composition. Selection and addition of such an additive can be easily practiced by those skilled in the art.

The polyester resin composition according to the present invention may be prepared by any known method for preparing a resin composition. For example, the polyester resin composition may be prepared in pellet form by mixing the above components and optionally one or more other additives, followed by melt extrusion in an extruder. The prepared pellets may be formed into a molded article through injection molding or compression molding, without being limited thereto. Selection and application of a suitable molding method can be easily practiced by those skilled in the art.

In addition, the polyester resin composition according to the present invention can exhibit excellent impact resistance and optical reliability and thus can be used as a material for a reflector of various light emitting devices such as LEDs. For example, the polyester resin composition may be used as a reflector for light emitting devices including electric/electronic components, indoor/outdoor lights, automobile lights, displays, and the like.

FIG. 1 is a sectional view of a semiconductor device (package) including a reflector formed of a polyester resin composition according to one embodiment of the invention. Referring to FIG. 1, the polyester resin composition according to this embodiment may be formed into a reflector 1 having various shapes. The reflector 1 may be assembled with an electrode 2, a substrate 3, a sealing resin 4, a wire 5, and a light emitting diode (LED) 6 to form a product including light emitting diodes (LEDs) and organic light emitting diodes (OLEDs), such as semiconductor devices and luminaires. It should be understood that the aforementioned features can be modified or changed in various forms by those skilled in the art.

A molded article including the polyester resin composition according to the present invention may have an Izod impact strength of about 15 kgf·cm/cm to about 20 kgf·cm/cm, as measured on a ⅛" thick unnotched Izod specimen in accordance with ASTM D256.

The molded article may have an initial reflectance of about 90% or higher, as measured at a wavelength of 450 nm using a colorimeter and have a reflectance retention rate of about 85% to about 99%, as calculated by Equation 1:

$$\text{Reflectance retention rate } (R_V) \, (\%) = \{(R_1/R_0)\} \times 100 \quad (1),$$

wherein $R_0$ is initial reflectance of the molded article as measured at a wavelength of 450 nm using a colorimeter, and $R_1$ is reflectance of the molded article after irradiation at a wavelength of 450 nm for 1,000 hours using an LED light source in a thermos-hygrostat oven at 85° C./85% RH.

Through repeated testing, it could be confirmed that the numerical limitations as described above can have critical significance in that the polyester resin composition according to the present invention can have excellent impact resistance and optical reliability and thus can be used as a material for a reflector of light emitting devices.

Hereinafter, the present invention will be described in more detail with reference to the following examples. It should be understood that these examples are provided for illustration only and are not to be construed in any way as limiting the present invention. In addition, descriptions of details apparent to those skilled in the art will be omitted for clarity.

EXAMPLES

Details of components used in the following Examples and Comparative Examples are as follows:

(A-1) First Polyester Resin

A poly(1,4-cyclohexylene dimethylene terephthalate) (PCT) resin prepared through polycondensation of terephthalic acid with 1,4-cyclohexane dimethanol and having a trans/cis isomer ratio of 2.6 to 2.8 is used.

(A-2) Second Polyester Resin

A poly(1,4-cyclohexylene dimethylene terephthalate) (PCT) resin prepared through polycondensation of terephthalic acid with 1,4-cyclohexane dimethanol and having a trans/cis isomer ratio of 1.9 to 2.1 is used.

(B) White Pigment

Titanium oxide having an average particle diameter of 0.25 μm is used.

(C-1) First Inorganic Filler

Glass fibers having an average diameter of 10 μm to 13 μm and an average length of 3.5 mm are used.

(C-2) Second Inorganic Filler

Wollastonite having an average diameter of 3 μm is used.

(D) Impact Modifier

An ethylene/methyl acrylate (EMA) copolymer including 30% of a methyl acrylate comonomer is used.

Polyester resin compositions of Examples and Comparative Examples are prepared in amount ratios as listed in Table 1. The amount of each of (A-1), (A-2), (B), (C-1), and (C-2) is represented in % by weight (wt %) based on the total weight of (A-1), (A-2), (B), (C-1), and (C-2), and the amount of (D) is represented in parts by weight based on 100 parts by weight of (A-1), (A-2), (B), (C-1), and (C-2).

The components are added in amounts as listed in Table 1, followed by melting/kneading using a twin-screw type melt extruder at 240° C. to 350° C., thereby preparing a resin composition in pellet form. Then, the prepared pellets are dried at 100° C. for 3 hours or more, followed by injection molding using a screw type injection molding machine at 240° C. to 330° C., thereby preparing a specimen for property evaluation.

TABLE 1

|  | Example | | | | | Comparative Example | | |
|---|---|---|---|---|---|---|---|---|
|  | 1 | 2 | 3 | 4 | 5 | 1 | 2 | 3 |
| (A-1) First polyester resin | 15 | 20 | 25 | 30 | 35 | 5 | 45 | 0 |
| (A-2) Second polyester resin | 30 | 25 | 20 | 15 | 10 | 40 | 0 | 45 |
| (B) White pigment | 35 | 35 | 35 | 35 | 35 | 35 | 35 | 35 |
| (C-1) First inorganic filler | 10 | 10 | 10 | 10 | 10 | 10 | 10 | 10 |
| (C-2) Second inorganic filler | 10 | 10 | 10 | 10 | 10 | 10 | 10 | 10 |
| (D) Impact modifier | 1 | 1 | 1 | 1 | 1 | 1 | 1 | 1 |

Specimens prepared in amount ratios as listed in Table 1 are evaluated as to impact resistance and optical reliability according to the following methods. Results are shown in Table 2.

Property Evaluation (1) Crystallization temperature (Tc): Crystallization temperature of each of the specimens is measured using a Super-cooling DSC (produced by PerkinElmer, Inc.) while cooling the specimen at a cooling rate of −100° C./min.

(2) Impact resistance (Izod impact strength): Impact resistance is measured on ⅛" thick unnotched Izod specimens in accordance with ASTM D256.

(3) Optical reliability (light reflectance retention rate): Initial reflectance ($R_0$) is measured on a plate-type specimen at a wavelength of 450 nm. Then, reflectance ($R_1$) after constant temperature and constant humidity evaluation is measured after irradiation at a wavelength of 450 nm for 1,000 hours using an LED light source in a thermo-hygrostat oven at 85° C./85% RH. Reflectance retention rate ($R_V$) is calculated according to Equation 1. Here, as a reflectometer, a CM3600 CIE Lab. Colorimeter (produced by KONICA MINOLTA HOLDINGS, INC.) is used.

$$\text{Reflectance retention rate } (R_V) (\%) = \{(R_1/R_0)\} \times 100, \quad \text{Equation 1}$$

wherein $R_0$ is initial reflectance of the molded article as measured at a wavelength of 450 nm using a colorimeter, and $R_1$ is reflectance of the molded article after irradiation at a wavelength of 450 nm for 1,000 hours using an LED light source in a thermos-hygrostat oven at 85° C./85% RH.

TABLE 2

|  | Example | | | | | Comparative Example | | |
|---|---|---|---|---|---|---|---|---|
|  | 1 | 2 | 3 | 4 | 5 | 1 | 2 | 3 |
| Crystallization temperature (Tc, ° C.) | 230.5 | 232 | 235 | 236 | 237 | 227 | 240 | 225 |
| Impact strength: Unnotched IZOD (kgf · cm/cm) | 17.3 | 17 | 16.5 | 16 | 15.3 | 18 | 12 | 17 |
| Initial reflectance ($R_0$) (%) | 93.6 | 93.7 | 93.4 | 93.5 | 93.3 | 93.8 | 93.1 | 93.8 |
| Reflectance after constant temperature and constant humidity evaluation ($R_1$) (%) | 84.7 | 84.3 | 83.0 | 84.8 | 84.8 | 78.3 | 84.8 | 77.1 |
| Reflectance retention rate ($R_V$) (%) | 90.5 | 90 | 88.9 | 90.8 | 90.9 | 83.5 | 91.1 | 82.2 |

As shown in Table 2, it can be seen that the polyester resin compositions prepared in Examples 1 to 5 have relatively good crystallinity, impact strength, and optical reliability as compared with the compositions prepared in Comparative Examples 1 to 3. In other words, it can be seen that the polyester resin compositions including two polyester resins having different trans/cis isomer ratios, that is, the first polyester resin (A-1) and the second polyester resin (A-2), in an amount ratio of 1:4 to 4:1 have a higher crystallization rate than those of Comparative Examples and thus could be injection molded in a high temperature mold, while exhibiting a high impact strength of 15 kgf·cm/cm or higher and a high optical reliability of 85% or higher.

Conversely, the polyester resin of Comparative Example 2 using the first polyester resin alone suffer from severe brittleness due to use of a highly crystalline polyester resin alone, causing excessively high crystallinity. In addition, the polyester resin of Comparative Example 3 using the second polyester resin alone has low crystallization rate and could not be injection molded in a high temperature mold since only the typical polyester resin is used together with an impact modifier. Further, it can be seen that the polyester resin composition including an excess of any one of two polyester resins having different trans/cis isomer ratios, such as an excess of the second polyester resin (A-2) having a trans/cis isomer ratio of less than 2.5, as in Comparative Example 1, has an impact strength of 18 kgf·cm/cm and thus exhibits high impact resistance, but had low crystallization temperature and thus exhibits poor optical reliability.

Therefore, from the above testing, it can be seen that the numerical limitations as described above can have critical significance in that the polyester resin composition according to the present invention can have excellent properties in terms of crystallinity, impact resistance, and optical reliability.

Although some embodiments have been described above, it should be understood that these embodiments are provided for illustration only and are not to be construed in any way as limiting the present invention, and that various modifications, changes, and alterations can be made by those skilled in the art without departing from the spirit and scope of the invention. Therefore, the scope of the present invention should be defined by the appended claims and equivalents thereof.

What is claimed is:

1. A polyester resin composition, comprising:
   (A-1) a first polyester resin comprising poly(1,4-cyclohexylene dimethylene terephthalate) (PCT) resin having a trans/cis isomer ratio of about 2.6 to about 3.0; and
   (A-2) a second polyester resin comprising poly(1,4-cyclohexylene dimethylene terephthalate) (PCT) resin having a trans/cis isomer ratio of about 1.8 to about 2.1;
   (B) a white pigment comprising titanium oxide; and
   (C) an inorganic filler,
   wherein a weight ratio of the first polyester resin (A-1) to the second polyester resin (A-2) ranges from about 1:4 to about 4:1,
   wherein the inorganic filler (C) comprises (C-1) a first inorganic filler and (C-2) a second inorganic filler, and wherein the first inorganic filler (C-1) comprises glass fibers and the second inorganic filler (C-2) comprises wollastonite, wherein a weight ratio of the first inorganic filler (C-1) to the second inorganic filler (C-2) ranges from about 1:3 to about 3:1, and wherein the polyester resin composition has a crystallization temperature (Tc) of about 230° C. to about 250° C., as measured by differential scanning calorimetry (DSC) while cooling the resin composition at a cooling rate of −100° C./min.

2. The polyester resin composition according to claim 1, further comprising: (D) an impact modifier.

3. The polyester resin composition according to claim 1, comprising:
  about 10 wt % to about 40 wt % of the first polyester resin (A-1);
  about 10 wt % to about 40 wt % of the second polyester resin (A-2);
  about 10 wt % to about 60 wt % of the white pigment (B); and
  about 5 wt % to about 40 wt % of the inorganic filler (C).

4. The polyester resin composition according to claim 1, wherein each of the first polyester resin (A-1) and the second polyester resin (A-2) comprises a poly(1,4-cyclohexylene dimethylene terephthalate) (PCT) resin represented by Formula 1:

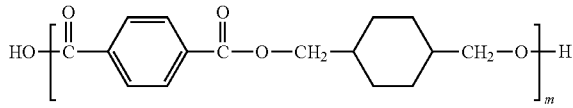

wherein m is an integer from 50 to 500.

5. The polyester resin composition according to claim 1, wherein a total amount of the first polyester resin (A-1) and the second polyester resin (A-2) ranges from about 30 wt % to about 70 wt % based on the total weight of (A-1), (A-2), (B), and (C).

6. The polyester resin composition according to claim 1, wherein each of the first polyester resin (A-1) and the second polyester resin (A-2) has an intrinsic viscosity (TO) of about 0.4 dl/g to about 1.5 dl/g, as measured in an o-chlorophenol solution at 25° C.

7. The polyester resin composition according to claim 1, wherein the titanium oxide has an average particle diameter of about 0.05 μm to about 2.0 μm.

8. The polyester resin composition according to claim 1, further comprising an additive selected from the group consisting of antioxidants, photostabilizers, fluorescent brighteners, antistatic agents, release agents, heat stabilizers, dyes, nucleating agents, plasticizers, admixtures, colorants, stabilizers, lubricants, flame retardants, and mixtures thereof.

9. A molded article produced using the polyester resin composition according to claim 1.

10. The molded article according to claim 9, wherein the molded article is a reflector for LEDs.

11. The molded article according to claim 9, wherein the molded article has an Izod impact strength of about 15 kgf·cm/cm to about 20 kgf·cm/cm, as measured on a ⅛" thick unnotched Izod specimen in accordance with ASTM D256, and an initial reflectance ($R_0$) of about 90% or higher, as measured at a wavelength of 450 nm using a colorimeter.

12. The molded article according to claim 11, wherein the molded article has a reflectance retention rate of about 85% to about 99%, as calculated by Equation 1:

Reflectance retention rate $(R_r)$ (%)={$(R_1/R_0)$}×100 wherein $R_0$ is initial reflectance of the molded article as measured at a wavelength of 450 nm using a colorimeter, and $R_1$ is reflectance of the molded article after irradiation at a wavelength of 450 nm for 1,000 hours using an LED light source in a thermos-hygrostat oven at 85° C./85% RH.

* * * * *